United States Patent [19]

Roemer et al.

[11] Patent Number: 4,887,039

[45] Date of Patent: Dec. 12, 1989

[54] METHOD FOR PROVIDING MULTIPLE COAXIAL CABLE CONNECTIONS TO A RADIO-FREQUENCY ANTENNA WITHOUT BALUNS

[75] Inventors: Peter B. Roemer; William A. Edelstein, both of Schenectady, N.Y.; Cecil E. Hayes, Wauwatosa; Matthew G. Eash, Oconomowoc, both of Wis.

[73] Assignee: General Electric Company, Schenectady, N.Y.

[21] Appl. No.: 288,668

[22] Filed: Dec. 22, 1988

[51] Int. Cl.$^4$ ............................................. G01R 33/20
[52] U.S. Cl. ...................................... 324/322; 324/318
[58] Field of Search ........................ 324/307, 318, 322; 343/742, 743, 744, 896

[56] References Cited

U.S. PATENT DOCUMENTS

| | | | |
|---|---|---|---|
| 4,680,548 | 7/1987 | Edelstein et al. | 324/318 |
| 4,692,705 | 9/1987 | Hayes | 324/318 |
| 4,740,752 | 4/1988 | Arakawa et al. | 324/318 |
| 4,752,736 | 6/1988 | Arakawa et al. | 324/318 |
| 4,782,298 | 11/1988 | Arakawa et al. | 324/318 |
| 4,820,987 | 4/1989 | Mens | 324/322 |

Primary Examiner—Michael J. Tokar
Assistant Examiner—Kevin D. O'Shea
Attorney, Agent, or Firm—Geoffrey H. Krauss; James C. Davis, Jr.; Marvin Snyder

[57] ABSTRACT

A method for providing plural coaxial cable connections, each to a different portion of a single radio-frequency (RF) antenna without requiring the use of isolation means at any RF connection, determines at least a point within the antenna having a desired common potential adjacent to each of the different portions to which one of the coaxial cable connections is to be made; Then forms a separate segment of each different portion which is located substantially at the common potential and is reactively separated from adjacent segments of the associated portion; and connects a shield conductor of an associated coaxial cable to the separate segment, while connecting a center conductor of that same associated coaxial cable to a selected one of the adjacent segments of that different portion.

20 Claims, 6 Drawing Sheets

METHOD FOR PROVIDING MULTIPLE COAXIAL CABLE CONNECTIONS TO A RADIO-FREQUENCY ANTENNA WITHOUT BALUNS

BACKGROUND OF THE INVENTION

The present invention relates to a radio-frequency (RF) antennae (single coils and multiple coil arrays) and, more particularly, to a novel method for providing multiple coaxial cable connections to an RF antenna without requiring the use of balanced-to-unbalanced transformers (baluns) at each connection.

It is well known to select an RF antenna to provide a desired RF current distribution which produces a desired RF magnetic field in a particular apparatus, e.g. in a nuclear magnetic residence (NMR) imaging system. Many types of desirable antennae, such as a quadrature volume imaging coil or a multiple surface coil array, require a plurality of separate input/output connections. Normally, each separate RF connection is a balanced connections. If an unbalanced, first coaxial cable is attached directly to the structure, the shield side of the coaxial cable is normally at ground potential, so that additional connections cannot be in coaxial form, because of the impossibility of providing a second shield attachment point which is a ground potential node, relative to the same ground potential at the first cable shield attachment point. Accordingly, the first coaxial cable attachment and/or the second coaxial cable attachment must be made to the RF antenna structure by means of an isolating circuit, such as a RF isolation transformer (a balun and the like), which prevents common mode currents from flowing while allowing passage of differential currents. Unfortunately, isolation transformers and/or baluns add at least one additional circuit element to the RF coil structure and, because these isolation components may have high voltages across their internal electronic components, place additional demands upon component tolerances, reliability, cost, and/or performance capability. It has been suggested to utilize inductive driving circuitry, including mutual-inductance coupling, to avoid direct multiple connections to the coil or coil array. Use of inductive drive is disadvantageous in that extra resonant structures must be manufactured and can each produce additional fields which may substantially add, in a potential deleterious fashion, to the RF fields already present within the NMR imaging volume. It is therefore highly desirable to provide a method for forming a plurality of RF connections to an RF antenna (a single coil or a coil array) in each of which connections a coaxial cable is connected directly to a different part of the antenna structure.

BRIEF SUMMARY OF THE INVENTION

In accordance with the invention, a method for providing plural coaxial cable connections, each to a different portion of a single radio-frequency (RF) antenna without requiring the use of isolation means at any RF connection, includes the steps of: identifying each different antenna portion to which a coaxial cable is to be attached; determining at least one point within the antenna adjacent to each of the cable connection portions and having a desired RF potential thereat; coupling a shield conductor of an associated coaxial cable an associated one of the at least one point; and connecting a center conductor of that same associated coaxial cable to a selected one of the plurality of different portions. The common potential can be at a point or along a line or surface within the antenna, or portion thereof, involved. The proper center conductor connection is selected to properly phase the connection with respect to the common potential, which is often chosen to be a virtual ground potential for the particular RF antenna. The reactive separation may be achieved by physically breaking all DC connection between the separate segment and the pair of segments adjacent thereto, and bridging each break gap with one of a pair of equal-valued capacitors, with values chosen to provide the correct input impedance at the separate segment cable connections. In all antennae, the cables at least initially leave the antenna along a plane passing through the common potential point or line.

In several presently preferred embodiments, each of a pair of coaxial cables is connected to a cylindrical "birdcage" coil at the center of a different axial conductor; a short center conductive segment (1) lies along a virtual ground line located between a pair of end rings, and (2) is capacitively isolated from adjacent segments of the axial conductor. The center segments are formed in two conductors radially spaced 90° from one another, to provide for excitation of a pair of orthogonal modes. Each coaxial cable is connected across one of the isolation capacitors, with the cable shield conductor connected to the center segment and the cable center conductor connected to an adjacent segment end upon the same side of the center segment.

In still other preferred embodiments, where it is not desirable or possible to excite plural resonant modes by use of a coaxial cable connected across a capacitive reactance at a common potential point, the cable shields are connected from the common potential line along continuous conductors of the antenna, to a point at which the cable inner conductor and shield conductor can be connected across a capacitive reactance. Here, the connected parts of the cable shields become part of the antenna structure.

Accordingly, it is an object of the present invention to provide a novel method for connecting each of a plurality of RF coaxial cables directly to a different portion of the RF structure of an RF antenna, containing at least one coil, without the use of RF balun and/or transformer means.

It is another object of the present invention to provide novel RF antennae, each having at least one coil, with each of a plurality of coaxial cables connected to a different portion of the antenna, without the use of at least one isolation means.

These and other objects of the present invention will become apparent upon reading the following detailed description, when considered in conjunction with the associated drawings.

DETAILED DESCRIPTION OF THE INVENTION

Figure 1:
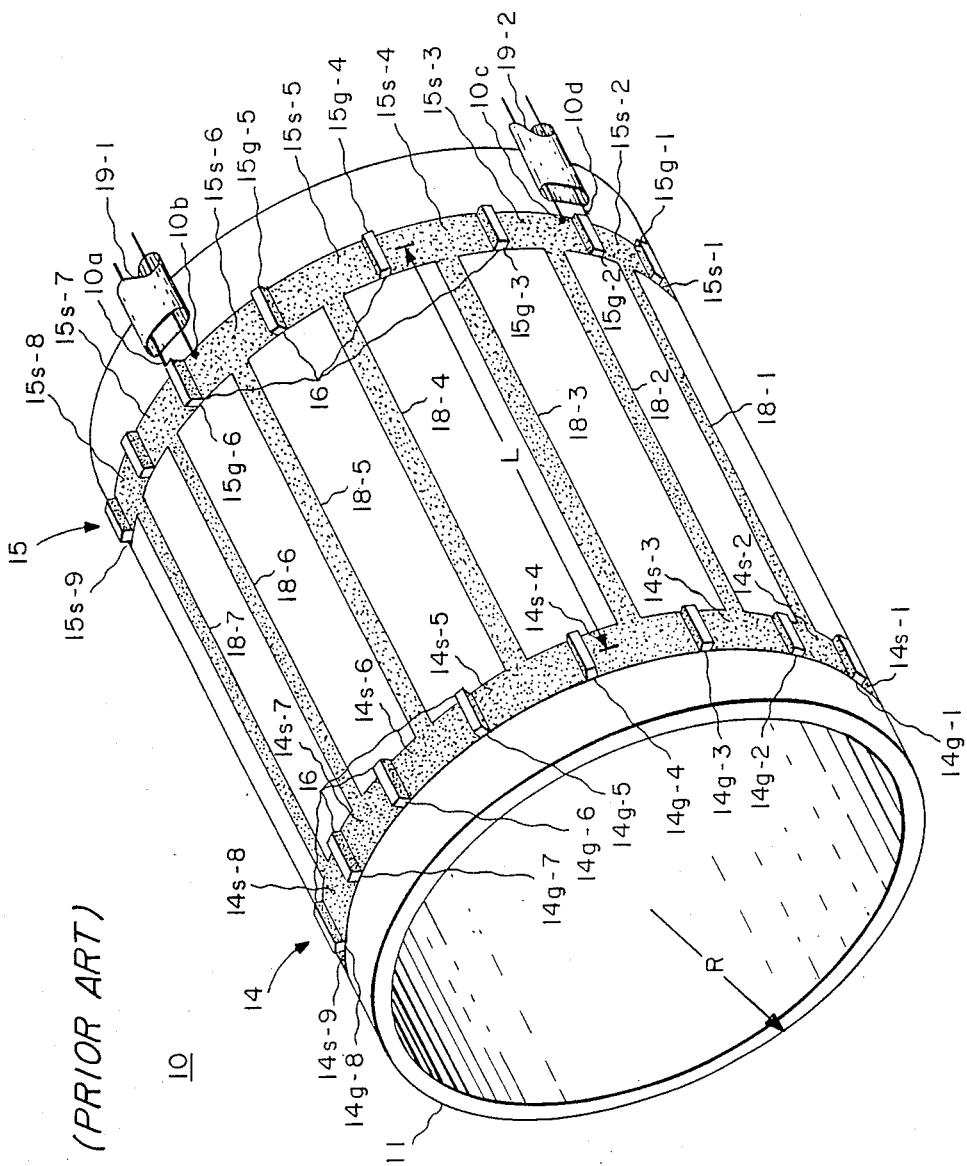
FIG. 1 is a perspective view of a prior art highpass birdcage RF coil antenna, and is useful for appreciating the problem solved by the present invention.

Referring initially to FIG. 1, a prior art highpass "bird-cage" RF coil antenna 10 is shown; the coil is described and claimed U.S. Pat. No. 4,680,548, issued July 14, 1987, assigned to the assignee of the present invention and incorporated herein by reference in its entirety. This form of antenna is useful for both transmission and reception of radio frequency (RF) signals, such as the RF magnetic fields in volume NMR imaging, and may also be used as a transmission coil in an NMR device utilizing RF surface coils for reception. The coil is built upon an insulative hollow member 11, which may be cylindrical with a circular cross-section and an outer surface radius R. A pair of opposed inductive end rings 14 and 15, here formed upon the member exterior surface, each have a plurality S of segments 14s or 15s (here, S=16 segments, of which segments 14s-1 through 14s-9 and 15s-1 through 15s-9 are shown). End rings 14 and 15 have a spacing length L between the midpoints thereof. Each of the gaps (14g or 15g) between the separated segments of the associated end ring, is electrically connected, or bridged, for RF with one of a like plurality S of capacitive elements 16. Each segment in one of the end rings (e.g. segment 14s-2 in end ring 14) is connected to the like-numbered segment in the other end ring (e.g. segment 15s-2 in end ring 15) by an integrally-joined axial conductive member 18 (e.g. conductive member 18-1). A balanced feed cable 19-1 has first and second conductors which are respectively connected to first and second RF connection points 10a and 10b, at end-ring conductive segments 15s-7 and 15s-6, respectively, upon either side of a first capacitive element 16, bridging on center-segment gap 15-6. To provide for transmission and/or reception in a quadrature-phased second mode, each of a pair of balanced conductors of a second feed cable 19-2 is respectively connected to one of third and fourth RF connection points 10c and 10d, at end-ring conductive segments 15s-3 and 15s-2, respectively, across a second capacitive element 16, bridging an inter-segment gap 15g-2 which is orthogonal to the gap 15g-6 across which the first pair of balanced cable conductors is attached. The pair of terminals 10a/10b is both physically and electrically orthogonal to the pair of terminals 10c/10d. It will be seen that, if, during transmit, the RF current at input 10a/10b is proportional to $\sin(\omega t)$, and the RF current at input 10c/10d is proportional to $\cos(\omega t)$, then a rotating RF magnetic field will be produced at least in the volume within coil 10. It is especially important to note that, if a single coaxial cable is considered for attachment directly between connection points 10a and 10b (say, with terminal 10a at electrical ground potential) and if a voltage (applied by this cable at terminals 10a and 10b) excites the coil in a resonant mode, corresponding to a sinusoidal current distribution around the coil end-ring peripheries, then terminals 10c and 10d will each have a very large RF potential thereat, relative to terminal 10a (and, in fact, also large relative to connection point 10b, because of resonance behavior), although terminals 10c and 10d may have zero potential therebetween. Therefore, attaching the shield conductor of a second coaxial cable at either terminal 10c or terminal 10d (which shield is, like the shield of the first coaxial cable, at electrical ground potential) will divert RF current in an undesirable way from the first resonant mode excited by the first coaxial cable connected across the first pair of terminal points 10a/10b, and destroy that coil mode. Thus, direct connection of a plurality of coaxial cables has been hitherto prohibited and a quadrature-phased coil of this type requires that a pair of balanced input cables 19-1 and 19-2 be used to directly feed the coil. If use of coaxial cables is desired, then the use of a balun transformer (not shown) is required between each coaxial cable and each balance cable for conversion of the normal unbalanced coaxial outputs of a transmitter and/or receiver means to the balanced cable forms shown. It is highly desirable to enable direct connection of a plurality of unbalanced, coaxial cables to RF antennae of the type normally fed only by balanced cables (as in the quadrature excitation of multiple-input imaging coils or other forms of RF coils and arrays thereof) without the use of baluns and the like isolation and/or transformation elements.

Figure 2:
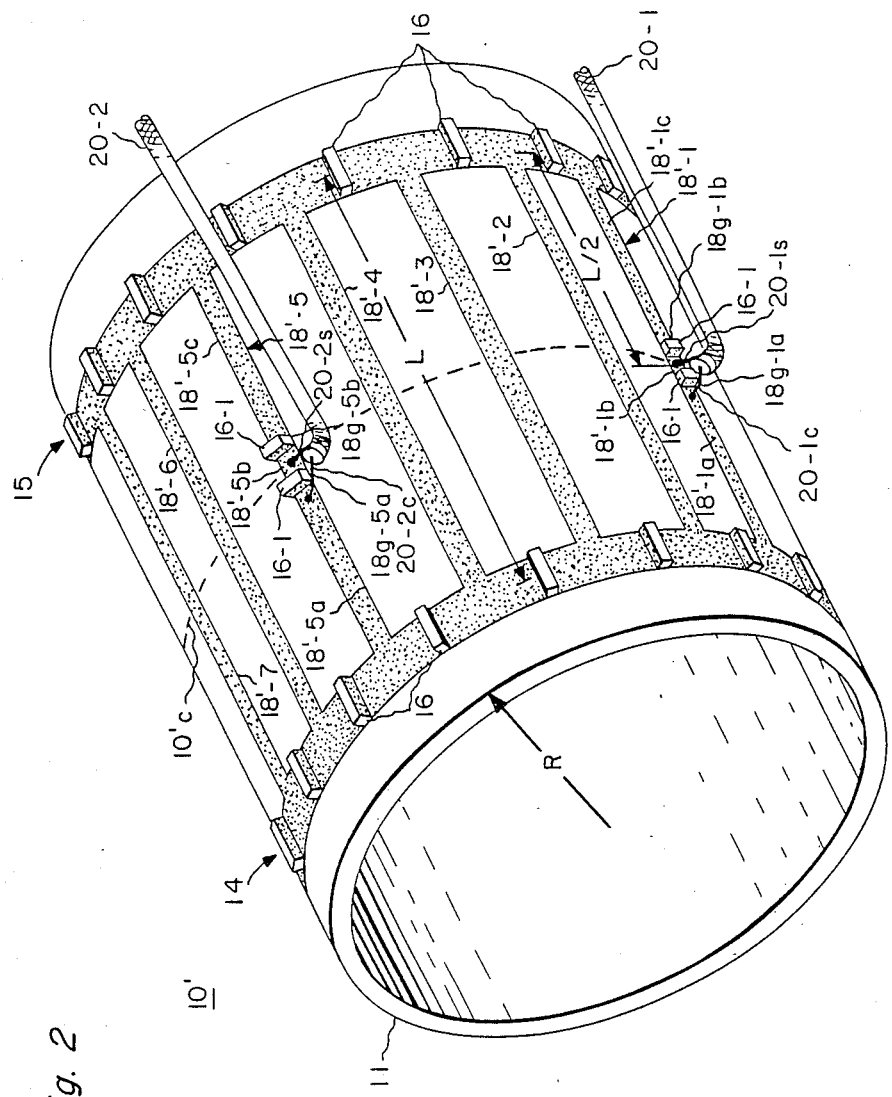
FIG. 2 is a perspective view of a high-pass birdcage RF coil antenna fed with a pair of separate coaxial cables in accordance with the present invention.

Referring now to FIG. 2, in accordance with one presently preferred embodiment of our invention, a high-pass birdcage coil 10' has a cylindrical insulative member 11 of radius R and length at least L. Upon the outer surface of member 11 is a pair of opposed conductive end rings 14 and 15 having the plurality S of segments, interconnected by a like plurality S of capacitive elements 16, and with a like plurality S of axial conductive members 18' integrally joined to, and connecting, the center portions of like-numbered segments. Full quadrature-phased use requires that each of the pair of excitation (or input/output) connection point pairs be connected to one of a pair of coaxial cables; the outer shields of the RF coaxial cables are at system common potential and are connected to the coil at one or more points which are constrained by the coil geometry to be at the same potential. If there is no potential difference between the coaxial cable shields at the attachment points, then common mode currents are not excited. Therefore, excitation of both orthogonal modes can be accomplished at the attachment points by attaching the coaxial cable center conductors across reactive isolation (capacitive) elements which have one end thereof attached to the common potential points. The common potential points will all lie upon a line, plane or surface of shape dependent upon the geometry of the particular RF antenna. In the illustrated antenna 10', a common potential line 10'c is located essentially midway between the conductive end-rings 14 and 15 at a distance L/2 from the midpoint of each end-ring. A pair of the axial conductive members are selected with 90° spacing to one another, e.g. conductive members 18'-1 and 18'-5, and are reconfigured to have a conductive first (left-hand) elongated portion, e.g. portion 18'-1a or portion 18'-5a, separated by a first gap, e.g. gap 18g-1a or 18g-5a, from a short conductive center portion, e.g. portion 18'-1b or 18'-5b, located essentially along the common potential line 10'c, and itself separated by another gap, e.g. gap 18g-1b or 18g-5b, from a second (right-hand) elongated portion, e.g. portion 18'-1c or 18'-5c. Each of the center-portion-defining gaps, e.g. gaps 18g-1a and 18g-1b or 18g-5a and 18g-5b, is bridged by one of a pair of capacitive isolation elements 16-1. A first coaxial cable 20-1 has the conductive shield 20-1s thereof connected to the first axial conductive member center portion 18'-1b, on the common potential line 10'c, and has the center conductor 20-1c thereof connected to the adjacent end of either elongated portion 8'-1a (as here) or 18'-1c, for excitation of a first coil resonance mode. The second, quadrature-phased, mode can be excited from a second coaxial cable 20-2, which has a conductive shield 20-2s connected to the center segment 18'-5b of the associated elongated conductor 18'5, and has its center conductor 20-2c connected to the adjacent end of the elongated conductive member portion (here, the adjacent end of conductive portion 18'-5a) located, for phasing uniformity, upon the same side of common potential imaginary line 10'c as the portion of the other driven conductor (18'-1a). Therefore, one coaxial cable 20: is provided for each of the modes to be excited; has a shield which is connected to the coil 10' in the center of one of the axial conductors 18' (which conductors are, for excitation of first and second quadrature-phased modes, separated by a 90° angle); and has a center conductor which is connected to one side of one of the isolation reactive elements connected to the DC-isolated center portion of the same axial conductor. Summarizing, the centers of all axial conductors in the high-pass birdcage coil are constrained, by symmetry, to be at the same potential, so that the axial conductors which serve as 90° connection points are broken in the center and equal reactances (capacitors 16-1) are inserted. The conductive portion between the two capacitors remains at the same potential as the center of the other axial conductors, so that the cable shields can be attached to the capacitive divider center points and the center conductors can be attached across one of the capacitors. The capacitor values are chosen to give the correct input impedance at the connection point (with some chosen sample electrically loading the coil). Cables 20 are each radially brought away from the coil (i.e. perpendicular to the surface of the substantially-cylindrical coil form 11) and are then arranged to run substantially parallel to the cylindrical coil axis. If coil 10' is utilized as a whole body coil inside a RF shield which is placed within the interior of a gradient coil assembly (all being located in a NMR imaging device, as is well known to that art) each coaxial cable shield can be electrically connected to the RF shield, which is at RF ground potential.

Figure 3:
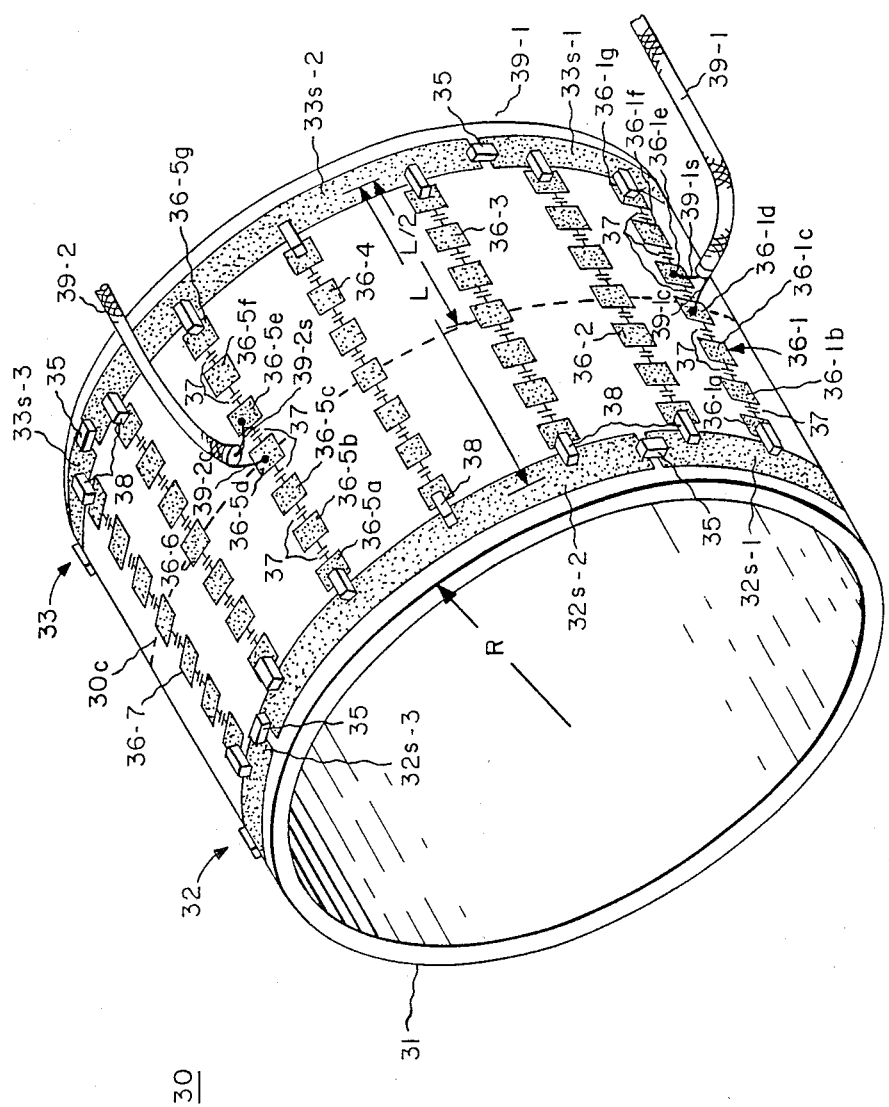
FIG. 3 is a perspective view of a low-pass birdcage RF coil antenna, illustrating a presently preferred embodiment of multiple coaxial cables connected thereto.

Referring now to FIG. 3, a low-pass form of birdcage coil 30, such as described and claimed in U.S. Pat. No. 4,692,705, issued Sept. 8, 1987, assigned to the assignee of the present application and incorporated herein in its entirety by reference, has the excitation inputs thereof driven via coaxial cables, using our invention. The coil is formed upon the exterior surface of a substantially cylindrical insulative member 31, of radius R, and has conductive end rings 32 and 33 each separated into a relatively small plurality $S'$ (here, $S'=4$) of respective left end ring segments $32s$ (with segments $32s$-1 through $32s$-3 being visible) and right end ring segments $33s$ (with segments $33s$-1 through $33s$-3 being visible). Each of the plurality $S'$ of gaps in the end rings is bridged by one of a like number $S'$ of capacitive elements 35, which prevent gradient-pulse eddy-current generation. A plurality n of one of axially-elongated conductive members 36 extend between each of left ring segments $22s$-i and the associated right wing segment $33s$-i, where $1 \leq i \leq S'$. Thus, in the illustrated embodiment, having a plurality $S=16$ of axial conductors 36 and $S'=4$ segments per end ring, there are $S/S'=n=4$ conductors 36 extended between each of the left and right end ring segments $32s$-i/$32s$-i. Unlike the high-pass coil 10, where the end rings have a net capacitive reactance and the axial conductors have net inductive reactance, as in an analogous $\pi$ form of a high-pass filter, the low-pass coil 30 has end rings with net inductive reactance and axial conductors each with net capacitive reactance, as in the analogous simple $\pi$ form of a low-pass filter. Each of conductors 36 is therefore separated in a plurality of segments 36-cs, where c is the designator of the conductor and s is the designator of the segment. The segments are joined to one another by capacitors 37 and the end segments joined to the end rings by capacitors 38; capacitors 37 and 38 can be of discrete or distributed form (as appropriate for the capacitance value and frequency of operation). Advantageously, each of axial conductors 36 is separated into an odd number p of conductive segments, e.g. the $p=7$ conductor segments 36-1a through 36-1g of a first axial conductor 36-1, with one of capacitive elements 37 bridging across each gap between a pair of conductive axial segments. Advantageously, each of the gap bridging capacitors 37 is of substantially the same capacitance reactance. Preferably, the center conductive segment (e.g. segment 36-1d or 36-5d) in at least that axial conductor (e.g. conductor 36-1 or 36-5) to which a coaxial cable (e.g. cable 39-1 or 39-2) is to be attached, lies along an imaginary common potential line, or surface, 30c of the coil. The cable shield conductor (e.g. shield 39-1s or 39-2s) is connected to the axial conductor segment (e.g. segment 36-1d or 36-3d) at the common potential surface, and the associated cable center conductor (e.g. center conductor 39-1c or 39-2c) is connected to an adjacent segment (e.g. segment 36-1e or -5e) of the same axial conductor. Ideally, the segment-gap-bridging capacitor 37, across which the coaxial cable is connected, should have a reactance selected for proper matching of the cable impedance; this capacitance should also be substantially identical to all other axial capacitances 7, which effect the antenna operating frequency—a tradeoff between frequency response and cable impedance match (VSWR) may be required. Note that cables 39 are initially radially disposed as they leave the coil, and are then moved into axial alignment; if an outer RF shield is used around coil 30 it is preferable to radially route the cables to the shield, attach the cables to the (RF ground potential) shield and then axial route the cables away from the coil.

Figure 4:
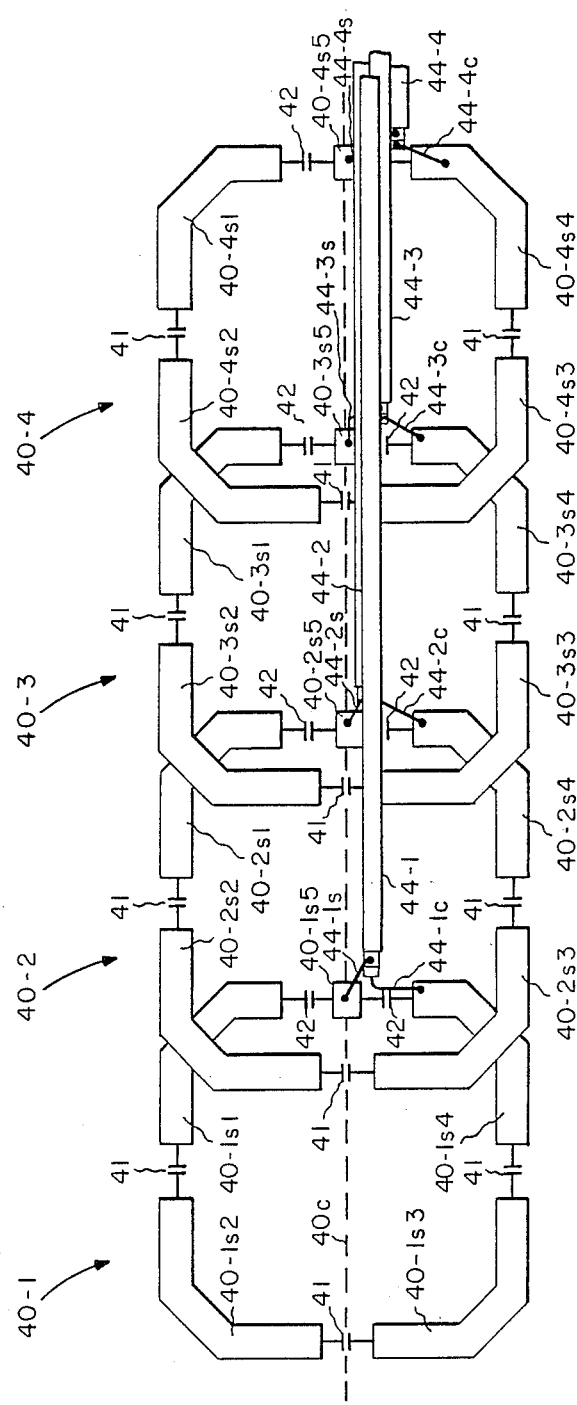
FIG. 4 is a plan view of an antenna formed of an array of RF surface coils, and of a presently preferred embodiment of multiple coaxial cables connected thereto.

Referring now to FIG. 4, an antenna 40 can be comprised of a plurality of individual RF coils, such as the four RF surface coils 40-1 through 40-4 of array antenna 40. As an example, the four surface coil array 40 can be as described and claimed in co-pending U.S. patent application Ser. 130,046, filed Dec. 7, 1987, now U.S. Pat. No. 4,825,162, assigned to the assignee of the present invention and incorporated herein in its entirety by reference. Any antenna using an array of separate RF coils, each of which is to be connected to a different one of a like plurality of coaxial cables, can utilize our method if a point, line or surface 40c at or along, which a desired common potential occurs throughout each coil of the array. It is especially helpful if each of the coils is capable of segmentation, to have at least one segment of each coil located along a common potential line/surface 40c and reactively separated from the remainder of the coil. In the illustrated example, each of the surface coils 40-1 through 40-4 is generally octagonal (being an intermediate case between rectangular/square and circular coils), and is segmented into a set of four main segments 40-i s1 through 40-i s4, where $1 \leq i \leq M$ and M is the number of coils in the array, and a fifth small segment 40-i s5, lying along common potential line 40c. Segments 40-i s1 through 40-i s4 are joined by capacitive elements 41, with the gaps between the coil segments 40-i s1 or 40-i s4 and the common potential segment 40-i s5 being bridged by capacitors 42. Each of capacitors 41 have a substantially identical capacitive reactance, while each of capacitors 42 have a substantially equal capacitance reactance; the capacitive reactances of capacitors 41 may be selected for proper tuning of each coil to a desired resonance frequency, while the capacitive reactances of capacitors 42 may be selected for proper matching of the coil to an associated coaxial cable 44-i. A shield conductor 44-is (e.g. shield 44-2s) of the associated coaxial cable 44-i (e.g. cable 44-F2) is connected to the associated coil common potential segment 40-i s5 (e.g. segment 40-2s5), while the coaxial cable center conductor 44-ic (e.g. center conductor 44-2c) is connected to an adjacent end of a like one of either adjacent segment 40-i s4 (segment 40-2s4 as here) or 40-i s1 (e.g. segment 40-2s1). For proper phasing, each of center conductors 44-ic (respective conductors 44-1c, 44-2c, 44-3c and 44-4c, here) are connected to a like-positioned segment, e.g. segment 40-i s4 (here, respective segments 40-1s4, 40-2s4, 40-3s4 and 40-4s4). Thus, in an array 40 of individual surface coils 40-i having segments separated by capacitors 41 which are symmetrical about the midplane of the individual surface coils, the surface coil midlines form a virtual ground, so that each cable 44i located along the surarray. face coil array midplane 40c can have its shield 44-is attached to the midpoint of isolation capacitors 42 and its center conductor attached across a like selected one of the isolation capacitors.

Figure 5:
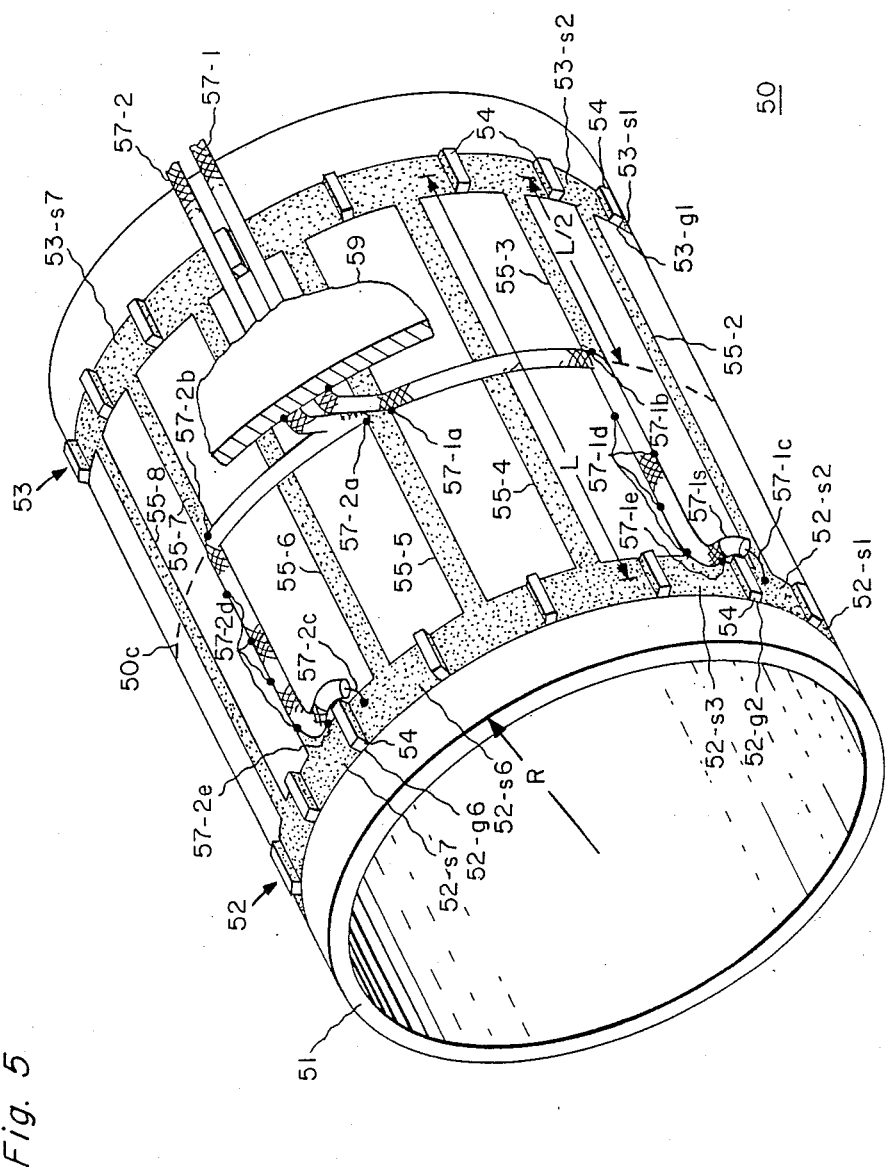
FIG. 5 is a perspective view of a high-pass birdcage RF coil antenna in which each of a plurality of coaxial cables is connected to end-ring capacitors.

Referring now to FIG. 5, it is often desirable to connect the center conductor of each of the plurality of coaxial cables directly to a different end ring segment, rather than to one of the axial conductors, as in coils 10' and 30 (of FIGS. 2 and 3, respectively). Our method also provides "balunless" connections across end ring capacitors, with coaxial cables brought into the coil at the coil midplane. Thus, a high-pass birdcage coil 50, fabricated upon the exterior surface of insulative cylinder 51 of radius R, has opposed end rings 52 and 53, each broken into a plurality S of segments (e.g. end ring segments 52-sj and 53-sj, where $1 \leq j \leq S$) each separated from the next segment by an inter-segment gap (e.g. gap 52-gS or 53-gS) bridged by the capacitive reactance of a capacitive element 54. A like number S of axial conductors 55-j extend from the midpoint of a like-numbered end ring segment 52-sj2 to an opposite end ring segment 53-sj (e.g. axial conductor 55-2 extends from the midpoint of left end ring segment 52-s2 to the midpoint of right end ring segment 53-s2). A pair of coaxial cables 57-1 and 57-2, one for each orthogonal mode to be excited, are brought together to the midpoint (i.e. at a distance L/2 from the centerline of either end ring, where the end rings are separated by a distance L) of that axial conductor (e.g. conductor 55-5) located midway between a pair of 90°-separated conductors (e.g. conductors 55-3 and 55-7). The coaxial cable shields 57-1s and 52-2s, respectively, are electrically connected, as by midpoint, as shown by connections 57-1a and 57-2a, at a common point along a selected conductor (here, along the coil common potential line 50c). The cables are then routed along common potential line 50c until the 90°-separated conductors 55-3 and 55-7 are reached. The shields are electrically connected to the separated conductor midpoints, at shield connection points 57-1b and 57-2b, respectively, along the common potential line 50c. Thereafter, the cables are arranged at right angles and run along the axial conductors, e.g. along conductors 55-3 and 55-7, and are electrically connected thereto at several locations, e.g. connections 57-1d and 57-2d, until a final connection location along the axial conductor is reached just short at the point at which that axial conductor integrally joins the end ring segment (e.g. segments 52-s3 or 52-s7) adjacent to a segment (e.g. 52-s2 or 52-s6) to which the coaxial cable center conductor 57-1c or 57-2c is to be connected. Thereafter, the cable is again arranged through substantially a right angle, so that the center conductor can be connected to the associated segment, preferably at the point at which the segment and its axial conductor integrally join one another. Thus, the two coaxial cables, having been routed in opposite directions after their initial contact at a common point (here, on the common potential plane) are routed along two respective axial conductors (55-3 and 55-7) which are physically and electrically 90° apart. The cable shield sections between common potential line connection points 57-1b/57-2b and axial conductor end connection points 57-1e/57-2e, become part of the associated axial conductor 55-3 or 55-7. That is, coil currents actually flow on the cable shield sections between connection points 57-1d and 57-1e, or points 57-2d and 57-2e. By Gauss' law, for any charge applied to the exterior surface of each coaxial cable shield (as by the birdcage coil currents), the potential on the shield exterior surface must be the same at every point as the potential on the shield interior surface and the potential at the cable center conductor. Therefore, any differential voltage impressed on the inside of the cable as a TEM-mode electromagnetic wave will be faithfully transmitted to the coil terminal at the connection of the cable center conductor and the associated end ring segment. By Gauss' theorem, this differential voltage will also have no effect on the potential on the cable exterior shield surface.

Figure 6:
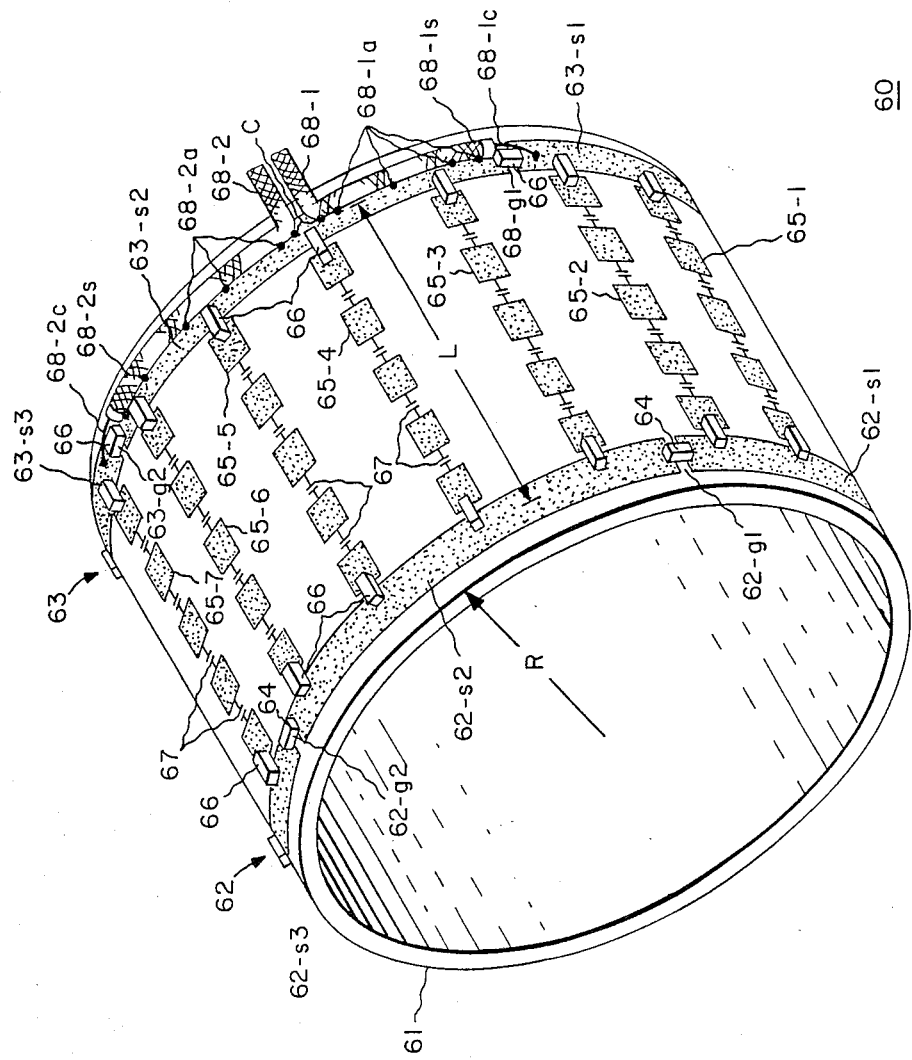
FIG. 6 is a perspective view of a presently preferred low-pass birdcage RF coil antenna having a plurality of coaxial input cables attached to end-rings thereof.

Referring now to FIG. 6, direct connections to end ring segments, in quadrature mode applications, can also be provided, in a slightly different manner, for a low-pass birdcage coil 60. Here, since the axial conductors are net capacitive reactances, an inductive portion of the cable shield can not carry coil currents in the axial direction. Instead, the shields of all of the plurality of coaxial cables 68 are connected to a common point, with some potential (which need not be a ground potential) thereat; in the illustrated embodiment, this common potential point is location C at the middle of end ring segment 63-s2. The common point is located substantially midway between the locations and RF potentials at which the cable center conductors are to be attached (e.g. the near ends of end-ring segments 63-s1 and 63-s3, for attachment of center conductors 68-2c and 68-2c, respectively) just beyond one of capacitors 66. The cable shields 68-1s and 68-2s are connected, as by soldering and the like attachments, to the end ring segment (e.g. segment 63-s2) at several points 68-1a and 68-2a, and each shield essentially becomes part of the end ring and has RF end ring current flowing on the external surface thereof.

While several presently preferred embodiments of the present invention are presented herein by way of explanation and illustration, many variations and modifications will now occur to those skilled in the art. It is our intent, therefore, to be limited only by the scope of the appending claims and not by the specific details and instrumentalities presented by way of explanation therein.

What we claim is:

1. A method for providing plural coaxial cable connections, each directly to a different one of a plurality of different portions of a single radio-frequency (RF) antenna, without requiring isolation means at any RF connection, comprising the steps of:
   (a) identifying each different antenna portion to which a coaxial cable is to be attached;
   (b) determining at least one point within the antenna adjacent to each of the cable connection portions and having a desired RF potential thereat;
   (c) coupling a shield conductor of each cable to an associated one of the at least one point; and
   (d) connecting a center conductor of an associated cable to a selected one of the plurality of different portions.

2. The method of claim 1, wherein step (b) includes the step of extending the desired RF potential point to at least one of a potential line and a potential surface.

3. The method of claim 2, wherein step (c) includes the steps of: (c1) forming in each different portion a separate segment which is located substantially at the common potential; (c2) reactively coupling each separate segment to adjacent segments of the associated portion; and (c3) directly connecting the shield conductor of the associated different cable to that separate segment associated with the different portion for that cable.

4. The method of claim 3, wherein the antenna is an RF coil having a pair of opposed end rings, and each different portion is an axial conductor connected between the end rings; and step (b) includes the step of locating the common potential line substantially midway between the end rings.

5. The method of claim 4, further comprising the steps of: forming a separate conductive segment in each axial conductor, substantially at the common potential line, by breaking the conductor and reactively isolating the broken segment from the adjacent parts of that axial conductor; and directly connecting the associated cable center conductor to that end of the axial conductor adjacent part chosen to properly phase the connection with respect to the common potential.

6. The method of claim 3, wherein the antenna is an array of a plurality of different RF coils, with each coil being a different portion; and step (b) includes the step of locating the common potential line substantially midway through each of the different coils.

7. The method of claim 6, further comprising the steps of: forming a separate conductive segment in a conductor of each of the different coils, substantially at the common potential line, by breaking the conductor and reactively isolating the broken segment from the adjacent parts of that conductor; and directly connecting the associated cable center conductor to that end of the adjacent part of the conductor chosen to properly phase the connection with respect to the common potential.

8. The method of claim 2, wherein the antenna is an RF coil having a pair of opposed end rings, and each different portion is a different axial conductor connected between the end rings at different locations thereon; step (a) includes the step of identifying the cable center conductor attachment points as being along one of the end rings; step (b) includes the step of locating the common potential line substantially midway between the end rings; and step (c) includes the steps of: (c1) connecting all of the cable shield conductors to a selected point on the common potential line; (c2) extending each cable generally along the common potential line to a selected associated different one of the axial conductors; and (c3) connecting each cable shield to the associated axial conductor, between the common potential line and up to one of the end rings.

9. The method of claim 8, wherein the coil end rings are separated into a plurality of segments, and each gap between adjacent segments is bridged by a capacitive element; and step (d) includes the step of directly connecting the center conductor of each cable to an end ring segment upon the opposite side of a capacitive element from the end ring segment to which the shield conductor of that cable is connected.

10. The method of claim 1, wherein the antenna is an RF coil having a pair of opposed end rings separated into a plurality of segments, and each gap between adjacent segments is bridged by a capacitive element; step (a) includes the step of identifying the cable center conductor attachment points as being along a selected one of the end rings; step (b) includes the step of locating the common potential point upon the selected end ring and substantially midway between the attachment points; and step (c) includes the steps of: (c1) connecting all of the cable shield conductors to the common potential point; and (c2) connecting each cable shield along at least part of the end ring segment, between the common potential point and an end of the end ring segment; and step (d) includes the step of connecting the center conductor of each cable to an end ring segment upon the opposite side of a capacitive element from the end ring segment upon the opposite side of a capacitive element from the end ring segment to which the shield conductor of that cable is connected.

11. A radio-frequency (RF) antenna, comprising: a plurality of RF coils, each having a conductor segment separated from a remainder of the RF coil and having thereon on a common RF potential essentially equal to the RF potential on the separated segment of any other one of the RF coils; the coils being arrayed to cause the common potential segment to lie upon one of a line and a surface; and
   a like plurality of coaxial cables, each associated with a different one of the RF coils, each having a shield conductor connected to the common potential segment of the associated RF coil, and having a center conductor directly connected to a selected point on the remainder of that RF coil.

12. The antenna of claim 11, further comprising reactive means for bridging each gap in each RF coil.

13. The antenna of claim 12, wherein the reactive means bridging the gap across which the coaxial cable is connected is a capacitive element.

14. The antenna of claim 13, wherein the capacitance of the capacitive element is selected to match the cable impedance to the RF coil at a selected frequency.

15. A radio-frequency (RF) antenna, comprising:
   an RF coil having a pair of opposed conductive end rings, each separated into a first plurality of segments, and a plurality of axial conductors, each extending between like positioned segments of the end rings; and a plurality of coaxial cables, each having a shield conductor connected to a selected one of a common potential point, a common potential line and a common potential surface upon the coil, and each having a center conductor directly connected to a different location upon the RF coil.

16. The antenna of claim 15, wherein a different one of the axial conductors is associated with each cable, each associated axial conductor having a segment thereof located at the common potential and separated from a remainder of that axial conductor; the associated cable shield conductor being connected to the axial conductor segment and the associated cable center conductor being connected to a predetermined location upon the remainder of that axial conductor.

17. The antenna of claim 16, further comprising reactive means for bridging each gap separating the segment and the remainder of any axial conductor; the cable center and shield conductors being connected across one of the reactive means.

18. The antenna of claim 17, wherein the RF coil is enclosed within an RF shield, and the cables are routed to the shield and the cable shield conductors connected thereto.

19. The antenna of claim 16, wherein a different one of the axial conductors is associated with each cable, each associated axial conductor having a location thereon at the common potential; all cable shield conductors being connected to the associated axial conductor between the common potential point thereon and an end thereof joined to one of the end ring segments; each cable center conductor being directly connected to another end ring segment.

20. The antenna of claim 15, wherein a different segment of one end ring is associated with each cable; all cable shield conductors being connected to another segment of the same end ring, different from all associated segments, at which the common potential is defined; each cable center conductor being directly connected to the associated end ring segment.

* * * * *